(12) United States Patent
Park et al.

(10) Patent No.: US 6,909,639 B2
(45) Date of Patent: Jun. 21, 2005

(54) NONVOLATILE MEMORY HAVING BIT LINE DISCHARGE, AND METHOD OF OPERATION THEREOF

(75) Inventors: Joo Weon Park, Pleasanton, CA (US); Poongyeub Lee, San Jose, CA (US); Eungjoon Park, Fremont, CA (US); Kyung Joon Han, Palo Alto, CA (US)

(73) Assignee: NexFlash Technologies, Inc., San Jose, CA (US)

( * ) Notice: Subject to any disclaimer, the term of this patent is extended or adjusted under 35 U.S.C. 154(b) by 30 days.

(21) Appl. No.: 10/421,458

(22) Filed: Apr. 22, 2003

(65) Prior Publication Data

US 2004/0213048 A1 Oct. 28, 2004

(51) Int. Cl.$^7$ .............................................. G11C 16/00
(52) U.S. Cl. .................................. 365/185.25; 365/204
(58) Field of Search .................... 365/185.25, 185.11, 365/204, 230.03

(56) References Cited

U.S. PATENT DOCUMENTS

| | | | | |
|---|---|---|---|---|
| 5,270,978 A | * | 12/1993 | Matsumoto et al. | 365/203 |
| 5,638,325 A | * | 6/1997 | Hamamoto | 365/185.25 |
| 5,703,820 A | * | 12/1997 | Kohno | 365/204 |
| 5,801,992 A | * | 9/1998 | Hirano | 365/185.25 |
| 6,018,487 A | * | 1/2000 | Lee et al. | 365/204 |
| 6,067,264 A | * | 5/2000 | Kwon | 365/203 |
| 6,424,572 B2 | * | 7/2002 | Sano | 365/185.25 |
| 6,487,124 B2 | * | 11/2002 | Semi | 365/185.25 |
| 6,510,084 B2 | * | 1/2003 | Ha | 365/185.25 |
| 6,775,184 B1 | | 8/2004 | Park et al. | 365/185.08 |

OTHER PUBLICATIONS

Brown, William D. and Brew, Joe E., eds., Nonvolatile Semiconductor Memory Technology: A Comprehensive Guide to Understanding and Using NVSM Devices, IEEE Press, New York, 1998, pp. 69, 105, 107–108, 203, 213–217, 226–227, 235–, 239–241, 244, 247, 279–281.

Brown, William D. and Brew, Joe E., eds., Nonvolatile Semiconductor Memory Technology: A Comprehensive Guide to Understanding and Using NVSM Devices, IEEE Press, New York, 1998, pp. 261–263.

Ohi, J. et al., An asymmetrical offset source/drain structure for virtual ground array flash memory with DINOR operation, Symposium on VLSI Technology, IEEE, 1993, pp. 57–58.

U.S. Appl. No. 10/358,645 entitled "Virtual Ground Single Transistor Memory Cell, Memory Array Incorporating Same, and Method of Operation Thereof", filed Feb. 4, 2003.

* cited by examiner

Primary Examiner—Tan T. Nguyen
(74) Attorney, Agent, or Firm—Altera Law Group, LLC

(57) ABSTRACT

The problem of bit disturb is reduced by discharging the floating bit lines of a nonvolatile memory array during programming. An illustrative virtual ground memory array uses single transistor floating gate type memory cells that are programmed using Fowler-Nordheim ("FN") tunneling, highly conductive and lengthy bit lines, buried and relatively short sub-bit lines and a programming discharge circuit for controlling spurious voltages on the bit lines that can arise when some of the bit lines are left floating during programming. Discharge control transistor respectively coupled to the bit lines direct current into a discharge section. A discharge section may be provided for each bit line, or shared by all bit lines. The discharge section may be a fixed circuit section for use through the programming process or may be selected from multiple discharge options.

19 Claims, 9 Drawing Sheets

FIG. 4

| MODE | MBL | | | | WL | | BSG | P WELL |
|---|---|---|---|---|---|---|---|---|
| | 0 | 1 | 2 | 3 | 4 | SELECT | NOT SELECT | | |
| ERASE AT BLOCK | -8V OR FLOAT | -8V OR FLOAT | -8V OR FLOAT | -8V OR FLOAT | -8V OR FLOAT | 10V | 0V | 6V OR FLOAT | -8V |
| PROGRAM AT SECTOR ("1""0") | 5V | FLOAT | 5V | FLOAT | 5V | -5V TO -12V | 0V | 6V | 0V |
| READ AT CELL 1361 | 0V | 0V | 1.5V | 1.5V | 1.5V | 3V | 0V | 6V | 0V |

FIG. 14

| $I_o$ | — | OPTION 900 | OPTION 1000 | OPTION 1100 |
|---|---|---|---|---|
| 1uA | 1.0uA | 0V | 0.5V | 0.7V |
| 10uA | 9.6uA | 0.04V | 0.51V | 0.7V |
| 100uA | 71uA | 0.28V | 0.65V | 0.78V |
| 1mA | 200uA | 0.8V | 0.9V | 0.94V |
| 10mA | 240uA | 0.96V | 0.98V | 0.99V |

NONVOLATILE MEMORY HAVING BIT LINE DISCHARGE, AND METHOD OF OPERATION THEREOF

BACKGROUND OF THE INVENTION

FIELD OF THE INVENTION

The present invention relates to semiconductor memory, and more particularly to a bit line discharge technique for a semiconductor memory array.

DESCRIPTION OF THE RELATED ART

Nonvolatile memory retains stored data when power is removed, which is required or at least highly desirable in many different types of computers and other electronic devices. Transistors suitable for use in nonvolatile semiconductor memory cells generally fall into one of two main classes. The first class is based on the storage of charge in discrete trapping centers of a dielectric layer of the structure. The second class is based on the storage of charge on a conducting or semiconducting layer that is completely surrounded by a dielectric, typically an oxide. A common programming and erase mechanism for such nonvolatile memory cells is Fowler-Nordheim ("FN") tunneling.

Since high memory density is desirable, several architectures are known that allow a significant decrease in effective cell size by eliminating source and drain contacts. FIG. 1 shows a contactless array architecture 100 that uses single floating gate transistor type memory cells in combination with continuous buried n+diffusions that form the respective source and drain lines. Illustratively, the drains and sources of transistors 101–103 are formed by the buried lines 110 ($D_{-1}$) and 120 ($S_{-1}$) respectively, the drains and sources of transistors 104–106 are formed by the buried lines 130 ($D_0$) and 140 ($S_0$) respectively, and the drains and sources of transistors 107–109 are formed by the buried lines 150($D_{+1}$) and 160 ($S_{+1}$) respectively. The contactless array architecture 100 is further described in M. Ohi et al., "An asymmetrical offset source/drain structure for virtual ground array flash memory with DINOR operation," VLSI Technology Symp., pp. 57–58, 1993.

FIG. 2 shows a contactless virtual ground array architecture 200 that uses single floating gate transistor type memory cells in combination with continuous buried lines that include n+diffusions. Each of the diffused lines except for the first and last in the array is shared by adjacent cells and serve as drain for one of the adjacent cells and as source for the other adjacent cell. Illustratively, the drains and sources of transistors 201–203 are formed by the buried lines 210 and 220 respectively, the drains aid sources of transistors 204–206 are formed by the buried lines 220 and 230 respectively, and the drains and sources of transistors 207–209 are formed by the buried lines 230 and 240 respectively. The transistors 201–209 have an offset source/drain structure in which the floating gate overlaps one adjacent column line, which serves as the drain (bit) line for the particular cell, but does not overlap the other adjacent column line, which serves as the source line for the particular cell. Programming of a selected transistor is achieved by placing 5 volts on its drain (bit) line, −9 volts on its control gate, float on its source line, and 0 volts on the substrate. Erasing is achieved with 10 volts on the control gate, −9 volts on the source line, and −9 volts on the substrate. Reading is achieved by placing 0.5 volts on the drain (bit) line, 3 volts on the control gate, 0 volts on the source line, and 0 volts on the substrate. The contactless virtual ground array architecture 200 is further described in M. Ohi et al. "An asymmetrical offset source/drain structure for virtual ground array flash memory with DINOR operation," VLSI Technology Symp. pp 57–58, 1993.

While the buried bit lines in memory arrays such as 100 and 200 are reasonably conductive, they do present an appreciable resistance as they increase in length. This problem is addressed by providing a highly conductive elevated bit lines, typically deposited metal lines, that run generally parallel to the buried bit line or buried bit line segments in some or all of the columns. Each metal line periodically contacts the buried bit lines or buried bit line segments associated with it, for example every sixteenth word line, to reduce the overall line resistance in each column. Due to elimination of the common ground line and the drain contact in each memory cell, extremely small cell size is realized in the contactless array architecture 200 of FIG. 2.

BRIEF SUMMARY OF THE INVENTION

Unfortunately, as memory cell size becomes smaller with more advanced smaller line width processes, the amount of coupling between adjacent highly conductive bit lines increases. Such coupling can lead to spurious voltages on floating bit lines, which in turn can disturb the state of unselected cells and cause excessively large leakage currents. Advantageously, the various embodiments of the invention control these spurious voltages.

These and other advantages are variously realized in the several embodiments of the present invention. One such embodiment of the present invention is a nonvolatile virtual ground integrated circuit memory array comprising a plurality of nonvolatile memory cells; a plurality of bit lines, the bit lines being coupled to respective subsets of the memory cells; and a spurious programming voltage discharge circuit coupled to the bit lines.

Another embodiment of the present invention is a nonvolatile virtual ground integrated circuit memory array comprising a plurality of asymmetrical single transistor floating gate memory cells; a plurality of main bit lines; a plurality of sub-bit lines coupled to the memory cells, each of the bit lines being coupled to a subset of the sub-bit lines; a plurality of discharge control transistors respectively coupled to the bit lines; and a discharge section coupled to the discharge control elements.

Another embodiment of the present invention is a nonvolatile virtual ground integrated circuit memory array comprising a plurality of asymmetrical single transistor floating gate memory cells; a plurality of main bit lines; a plurality of sub-bit lines coupled to the memory cells, each of the bit lines being coupled to a subset of the sub-bit lines; a plurality of discharge control transistors respectively coupled to the bit lines; a plurality of discharge sections wherein at least one of the discharge sections is optimized for discharging spurious voltage from cell leakage, and at least one of the discharge sections is optimized for discharging spurious voltage from bit line coupling; and a switching circuit having one terminal coupled to the discharge control transistors and a plurality of terminals respectively coupled to the discharge sections.

Another embodiment of the present invention is a method of discharging floating bit lines during programming of a nonvolatile virtual ground integrated circuit memory array having a plurality of memory cells. The method comprises placing data on selected ones of the bit lines, wherein unselected ones of the bit lines are floated; apply a programming pulse to selected ones of the memory cells, whereby spurious voltages are coupled to the floated bit lines; and discharging the spurious voltages from the floated bit lines during at least part of the applying step.

Another embodiment of the present invention is a method of discharging floating bit lines during programming of a nonvolatile virtual ground integrated circuit memory array having a plurality of memory cells. The method comprises placing program data on first selected ones of the bit lines, wherein first unselected ones of the bit lines are floated; apply a first programming pulse to a selected page of the memory cells, wherein first spurious voltages are coupled to the first floated bit lines from the first selected bit lines; discharging the first spurious voltages from the first floated bit lines; performing a verify read of the memory array to obtain verify data; placing the verify data on second selected ones of the bit lines, wherein second unselected ones of the bit lines are floated; apply a second programming pulse to the selected page of the memory cells, wherein second spurious voltages are coupled to the second floated bit lines from the second selected bit lines; and discharging the second spurious voltages from the second floated bit lines.

DESCRIPTION OF THE SEVERAL VIEWS OF THE DRAWINGS

FIG. 2 is a schematic diagram of a virtual ground array of single transistor floating gate type memory cells of the prior an.

FIG. 4 is a table of voltages suitable for operating a virtual ground memory array having single transistor memory cells like that of FIG. 3.

FIG. 14 is a table showing the characteristics of the discharge circuits of FIGS. 9–11.

DETAILED DESCRIPTION OF THE INVENTION, INCLUDING THE BEST MODE

Figure 1:
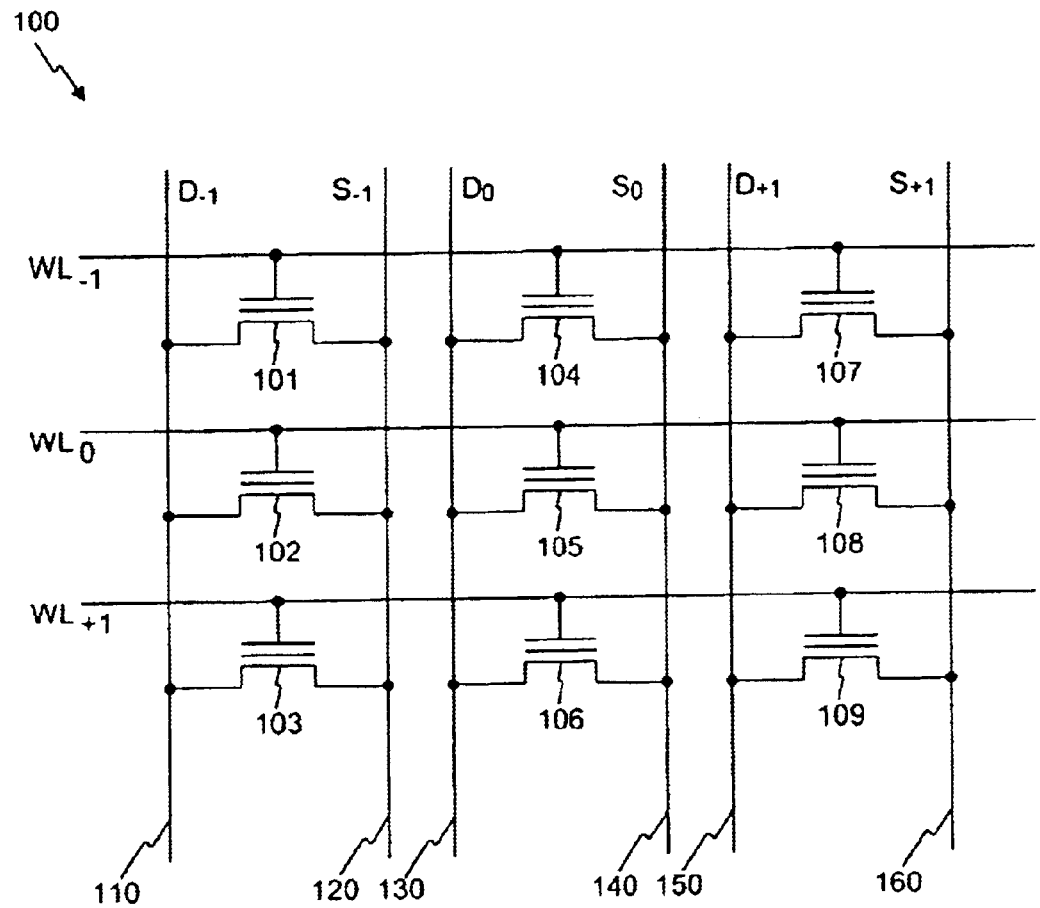
FIG. 1 is a schematic diagram of an array of single transistor floating gate type memory cells of the prior art.
Figure 2:
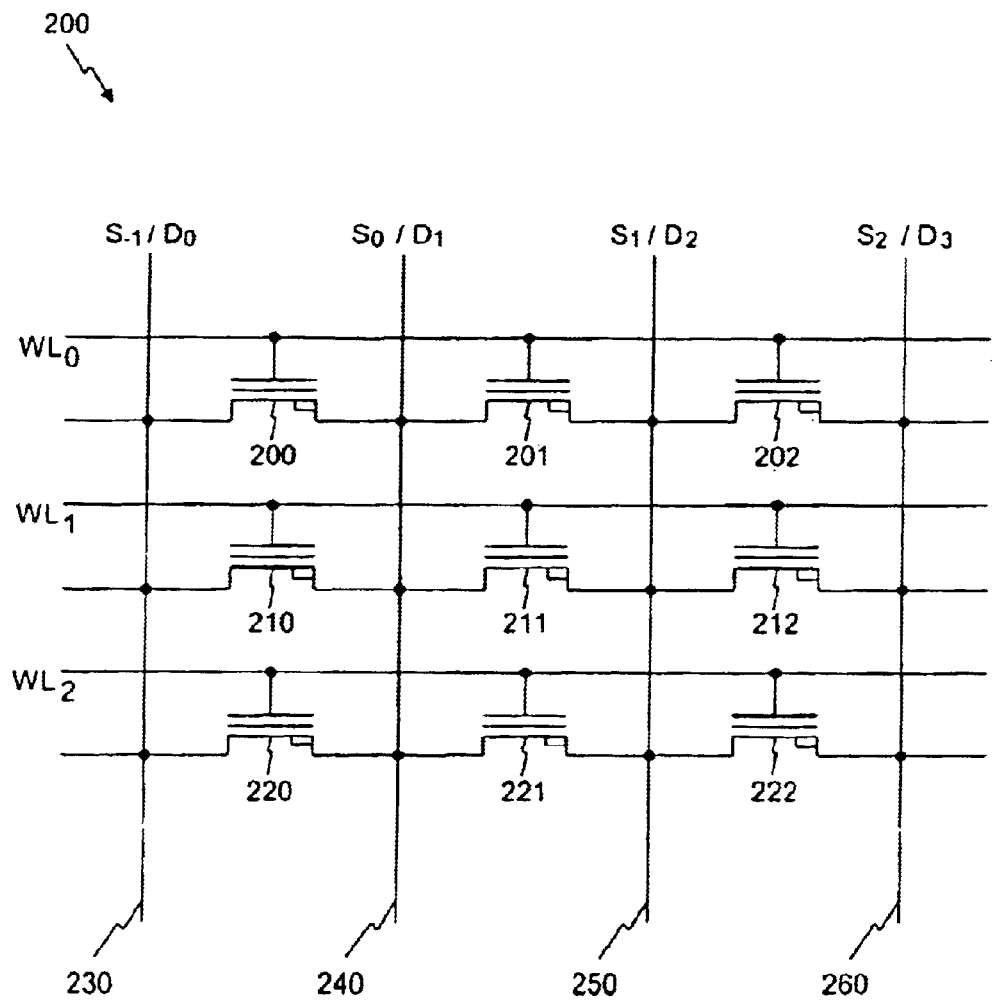
Figure 3:
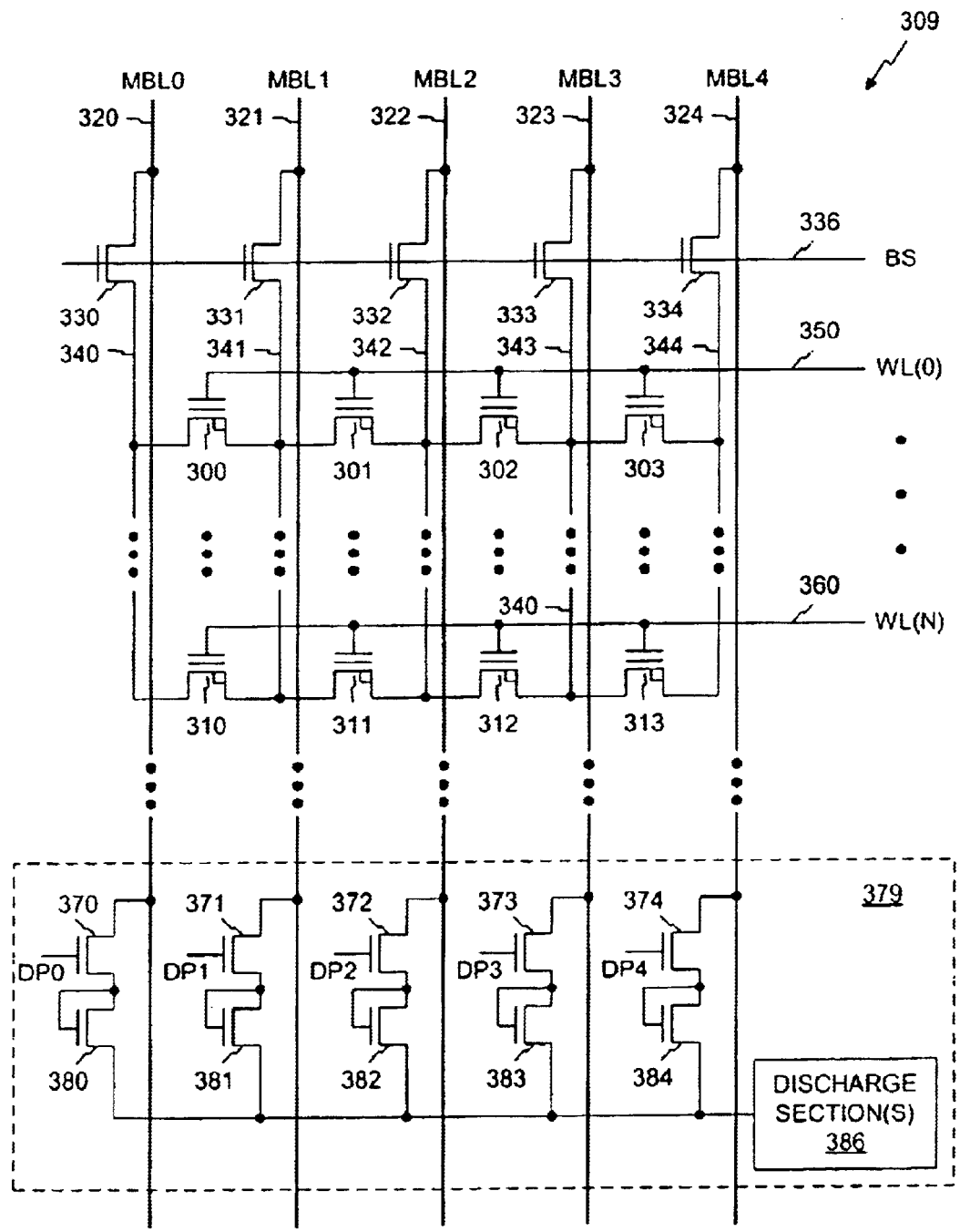
FIG. 3 is a schematic diagram of a virtual ground array of single transistor floating gate type memory cells having buried sub-bit lines and metal bit lines and including one or more bit line discharge section(s).

FIG. 3 shows a virtual ground memory array 300 that uses single transistor floating gate type memory cells that are programmed using Fowler-Nordheim ("FN") tunneling, highly conductive and lengthy bit lines, buried and relatively short sub-bit lines, and a programming discharge circuit 379 for controlling spurious voltages on the bit lines that can arise when some of the bit lines are left floating during programming. Although a bit line and sub-bit line type arrangement is shown in FIG. 3, it will be appreciated that the programming discharge circuit 379 may be used to control spurious voltages on any type of bit lines. It will also be appreciated that access to the memory cells from the bit lines may be direct or through various select transistors, as desired. FIG. 4 shows an illustrative set of voltages for operating the memory array of FIG. 3. It will be appreciated that the memory array 300 and the voltages shown in FIG. 4 are only examples of a suitable memory array architectures and suitable operating voltages, and that the bit line discharge technique used in the memory array 300 may be used in other different types of memory arrays and/or with different voltages. It will also be appreciated that the memory array 300 preferably is used with various peripheral circuits to create a nonvolatile memory integrated circuit. Suitable peripheral circuits are well known in the an and may include control logic, a cell-disturb control circuit, over-erase protection circuits, address latches, data buffers, row and column decoders, sense amplifiers, on-chip charge pumps, and programming timer circuits.

The illustrative memory array 309 of FIG. 3 has multiple blocks of memory cells, each of which is accessed through its respective group of block access transistors and includes "n" rows of memory cells. Each row of memory cells has a word line serving as the control gates of the memory cells. The illustrative block shown in FIG. 3 has 64 rows and 4224 asymmetrical single transistor floating-gate type memory cells in each row, a subset of which is shown in FIG. 3 by transistors 300–303 on zero word line 350 of the block, and by transistors 310–313 on the $63^{rd}$ word line 360 of the block (only four cells per word line are shown for clarity). Each block also has a number of diffused sub-bit lines, a subset of which are shown in FIG. 3 by the reference numerals 340–344, which are accessed through block respective block select transistors 330–334. The transistors 300–303 and 310–313 are asymmetrical single transistor floating-gate type memory cells, as indicated by thc small square on the source side each of the transistors which is suggestive of a lightly doped region. Adjacent transistors having their respective source and drain sharing a common sub-bit line support FN tunneling unequally, with Fowler-Nordheim tunneling being supported through the more heavily doped drain, and being suppressed through the more lightly doped source.

Due to the relatively high resistance of diffused lines, the sub-bit lines 340–344 do not run throughout all of the rows of the memory array, but instead arc limited in extent and are contacted by highly conductive bit lines 320–324, which do run throughout all of the rows of the memory array. Illustratively, the highly conductive bit lines 320–324 are metal-containing, preferably deposited aluminum, and the less conductive sub-bit lines 340–344 are embedded in the substrate, preferably implanted n+ doped lines.

Figure 5:
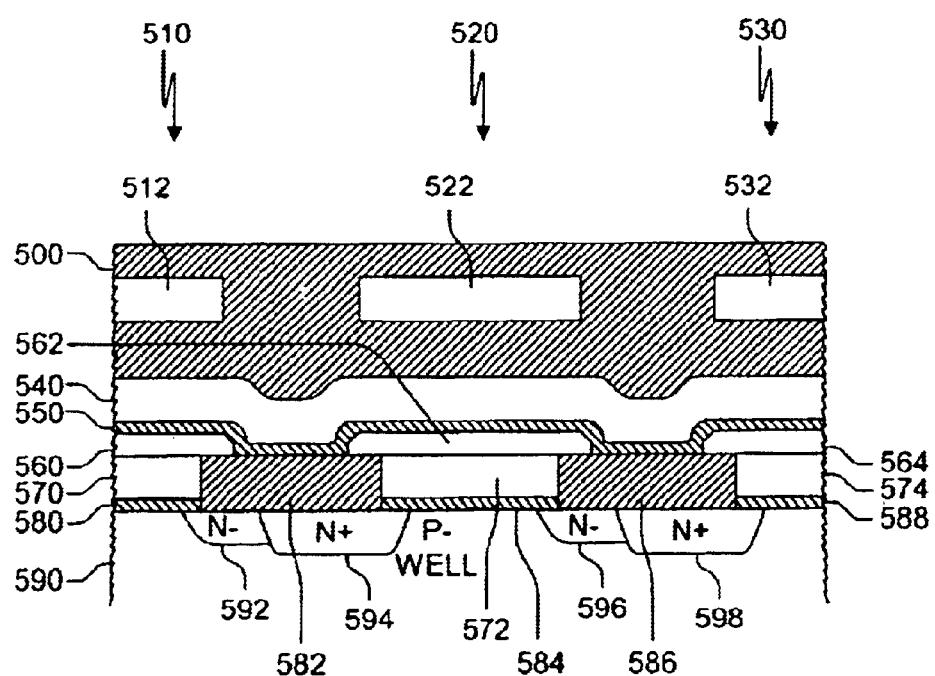
FIG. 5 is a cross-section view through a pan of an illustrative implementation of the virtual ground memory array of FIG. 3.

An illustrative asymmetrical single transistor floating gate type cell suitable for use in the illustrative memory array 309 of FIG. 3 is shown in the integrated circuit cross section of FIG. 5. A variety of processes are suitable for forming such single transistor cells, including the process described in U.S. patent application Ser. No. 10/358,645, filed Feb. 4, 2003 (Han et al., "Virtual ground single transistor memory cell, memory array incorporating same, and method of operation thereof," and in U.S. Provisional Patent Application No. 60/354,911, filed Feb. 4, 2002 (Han et al., "Virtual ground single transistor memory cell, memory array incorporating same, and method of operation thereof," which are hereby incorporated herein by reference in their entirety. As the transistors of FIG. 5 are programmed using the FN mechanism, a halo implant such as described in the aforementioned No. 60/354,911 publication is not needed and the halo implant steps of the process may be omitted. Other types of memory cells well know in the an may also be suitable.

FIG. 5 shows three virtual ground single transistor memory cells 510, 520 and 530 in cross section. The transistors 510 and 530 are shown partially and the transistor 520 is shown fully. With reference to transistor 520, a control gate formed by a portion of a word line 540 is space from an upper section 56' of a stacked floating gate by interpoly oxide 550. A lower section 572 of the stacked floating gale is spaced from a channel region by an ultra-thin tunnel oxide 584. The channel region is defined in a p-well on one side by a heavily doped n+ region 594 which is considered to be the drain, and on the other side by a lightly doped n− region 596 which is considered to be the source.

In a similar manner, transistor 510 has a stacked floating gate formed by lower section 570 and upper section 560. The lower section 570 is spaced away from the channel by the tunnel oxide 580, and the upper section 560 is spaced away from the word line 540, a portion of which acts as the control gate, by the interpoly oxide 550. The source for the transistor 510 is the n− region 592. In a similar manner, transistor 530 has a stacked floating gale formed by lower section 574 and upper section 564. The lower section 574 is spaced away from the channel by the tunnel oxide 588, and the upper section 564 is spaced away from the word line 540, a portion of which acts as the control gate, by the interpoly oxide 550. The drain for the transistor 530 is the n+ region 598.

When used in a virtual ground memory array architecture, the source and drain regions of adjacent cells preferably lie along a common bit line. For example, as shown in FIG. 5, one such bit line (the term "bit line" is inclusive of any line that carries data represented by varying voltage or current levels, including sub-bit lines) is formed by the n+ drain region 594, to which the n− source region 592 is adjacent. Another such bit line is formed by the n+ drain region 598, to which the n− source region 596 is adjacent. While the n+ drain regions along any particular bit line preferably are formed as a continuous line to maintain a uniformly low resistivity along the line, the n− source regions along the same particular bit line may be formed as a continuous line or as discrete regions merged with the n+ line.

Aluminum bit lines 512, 522 and 532 run side-by-side over all of the word lines (word line 540 being representative) and generally parallel to the sub-bit lines in each block, (sub-bit lines 594 and 598 being representative) and are respectively coupled to the sub-bit lines through block select transistors (not shown).

Memory cells such as the virtual ground single transistor memory cells 510, 520 and 530 shown in FIG. 5 may be erased in any desired manner by use of the Fowler-Nordheim mechanism, for example, a single row or multiple rows, a single block or multiple blocks, or the entire memory array. In the memory array 320 of FIG. 3, for example, illustratively all of the cells in a block are erased to a high $V_T$ state by bringing the p-well to a suitable negative voltage, illustratively −8 volts, and the word lines to a suitable positive voltage, illustratively 10 volts. The high $V_T$ state is achieved by Fowler-Nordheim tunneling of electrons from the substrate to the floating gates of the transistors in the block. The sub-bit lines 340–344 may be left floating if desired by floating the bit lines 320–324 and/or turning off the block select transistors 330–334 by applying −8 volts to their respective gates over the control line 336. Alternatively, the sub-bit lines 340–344 may be brought to the potential of the p-well by applying the same voltage to the bit lines 320–324 and turning on the block select transistors 330–334 by applying a suitable voltage to their respective gates over the control line 326.

One or more cells on a selected word line are programmed to a state opposite the erased state, illustratively a low $V_T$ state, as follows. Say one wishes to program every other cell in a word such as, for example, cells 300 and 302. The bit lines alternatively are brought to 5 volts and ground respectively; for example, bit lines 300 and 302 are brought to 5 volts while bit lines 301 and 303 are brought to ground. Word line 350, which in this example is the selected word line, is brought to a suitably negative voltage, say −5 volts, while the other non-selected word lines in the block, illustratively word line 360, are brought to 0 volts. The voltage on the hit lines 320–324 is coupled to the sub-bit lines 340–344 through respectively the block select transistors 330–334. Transistors 300 and 302 begin to program due to Fowler-Nordheim tunneling of electrons from their floating gates to their drains, under the influence of the 10 volt difference between their control gates and their drains. Transistors 301 and 303 do not program because the voltage difference of only 5 volts between their control gates and their drains is insufficient to support Fowler-Nordheim tunneling.

Due to normal variations between nonvolatile memory cells in a nonvolatile memory array, some cells may program more slowly than others. To avoid over-programming any of the nonvolatile memory cells, the initial program cycle is configured to program only the fastest memory cell by applying a programming pulse of illustratively −5 volts, and subsequent programming cycles are configured to program slower memory cells by applying progressively more negative programming pulses (illustratively −5.5 volts, −6.0 volts, −6.5 volts and so forth up to a maximum of say −12.0 volts) while avoiding programming previously programmed memory cells. When the initial program cycle completes, some of the memory cells in the nonvolatile memory array may not achieve a suitably low $V_{11}$ due to the normal variations. An automatic program-verify operation is performed to identify incompletely programmed memory cells, and to re-program them. Hence, additional programming cycles typically are done to completely program the array, although typically progressively fewer bit lines must be powered up to program progressively fewer incompletely programmed cells.

Individual cells may be read as follows. If transistor 301 is to be read, selected word line 350 is brought to 3 volts, bit lines 320 and 321 are brought to 0 volts, and bit lines 322, 323 and 324 are brought to 1.5 volts. The other non-selected word lines in the block are brought to 0 volts. The block select transistors 330–334 are all on, so that the sub-bit lines 340 and 341 are also at 0 volts, and the sub-bit lines 342, 343 and 344 are at 1.5 volts. Current flows through the transistor 301 and on the sub-bit line 341 and the bit line 321 if transistor 301 is in a low $V_T$ state, while no current flows through transistor 301 and on the sub-bit line 341 and the bit line 321 if transistor 361 is in a high $V_T$ state. The logical state of the transistor 361 is determined by sensing this current flow.

Figure 6:
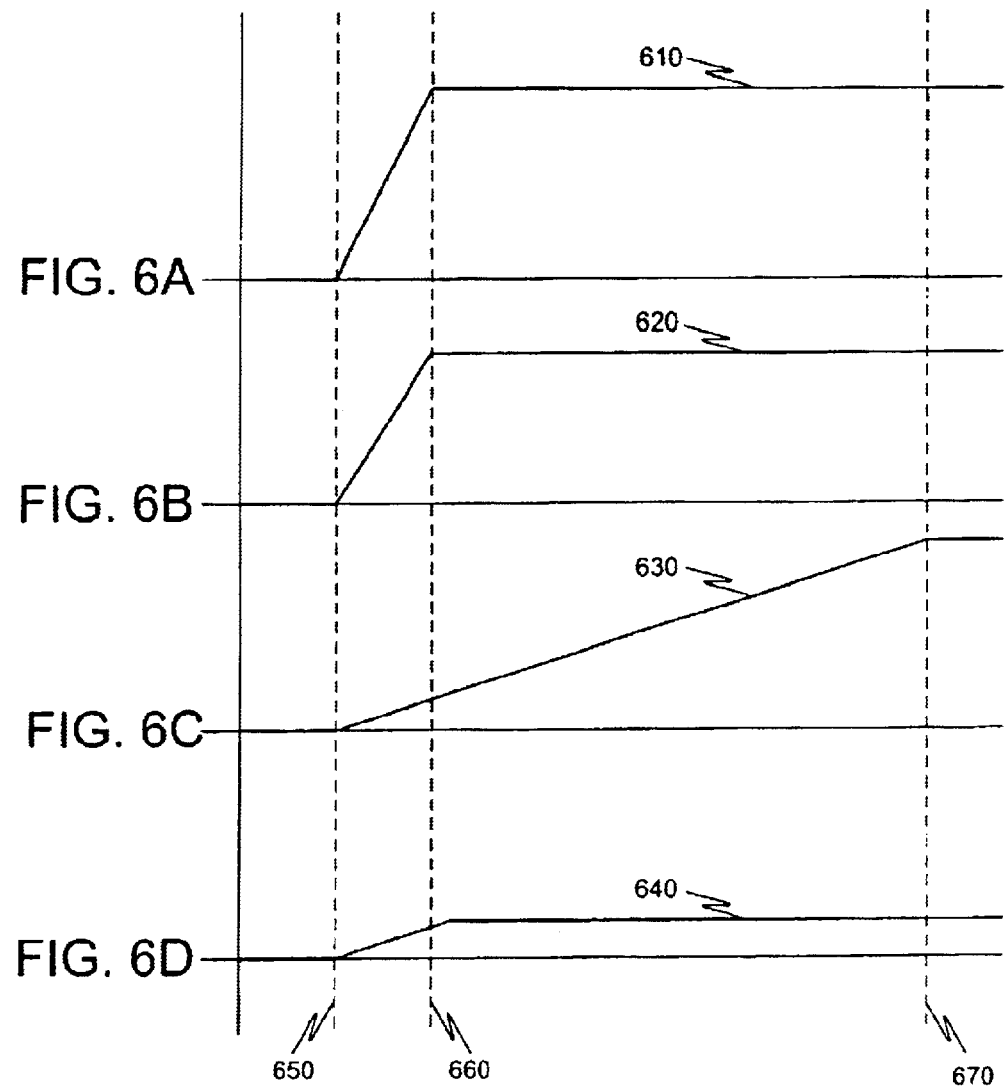
FIGS. 6A and 6B are charts of the voltage levels on respectively a powered bit line and a floating bit line, over time.
FIGS. 6C and 6D are charts of the voltage levels on respectively a powered bit line and a floating bit line with bit line discharge, over time.

Memory arrays that use memory cells programmed with the Fowler-Nordheim ("FN") tunneling mechanism suffer various bit line coupling and bit line leakage problems. Each metal bit line has a capacitance $C_{SW}$ to adjacent bit lines and a capacitance $C_{OX}$ to the substrate, which results in the coupling ratio $C_{CR}$ defined in equation (I) below. If $C_{SW}$ and $C_{NW}$ are illustratively assumed to have the values 0.575 pf and 0.45 pf respectively, the coupling ratio would illustratively be 71.8%. The impact of this coupling ratio is shown in FIG. 6A and FIG. 6B for the worst case in which every alternate bit line is selected. Each selected bit line illustratively ramps up to the program voltage of 5 volts in 1.9 μs (see FIG. 6A, curve 610 between time lines 650 and 660), and each of the floating unselected bit lines acquires a voltage of $C_{CR}*5$ volts in the same period of time (see FIG. 60, curve 620). For the illustrative coupling ratio of 71.8%, the voltage on the unselected bit line is about 3.6 volts.

$$C_{CR} = \frac{2C_{SW}}{2C_{SW} + C_{OX}} \quad (1)$$

Bit line coupling can lead to bit disturb, which is disturbing the charge on the floating gate of a selected cell on an unselected bit line to a sufficient extent that if the cell is fast, the cell will falsely program. A floating unselected bit line can have an appreciable voltage on it, illustratively about 3.6 volts, which may be enough to change unintentionally the logical state stored in the cell by discharge of the floating gate. This problem becomes increasingly more serious as programming pulses on the selected word line are made more negative to program the slower cells.

Figure 7:
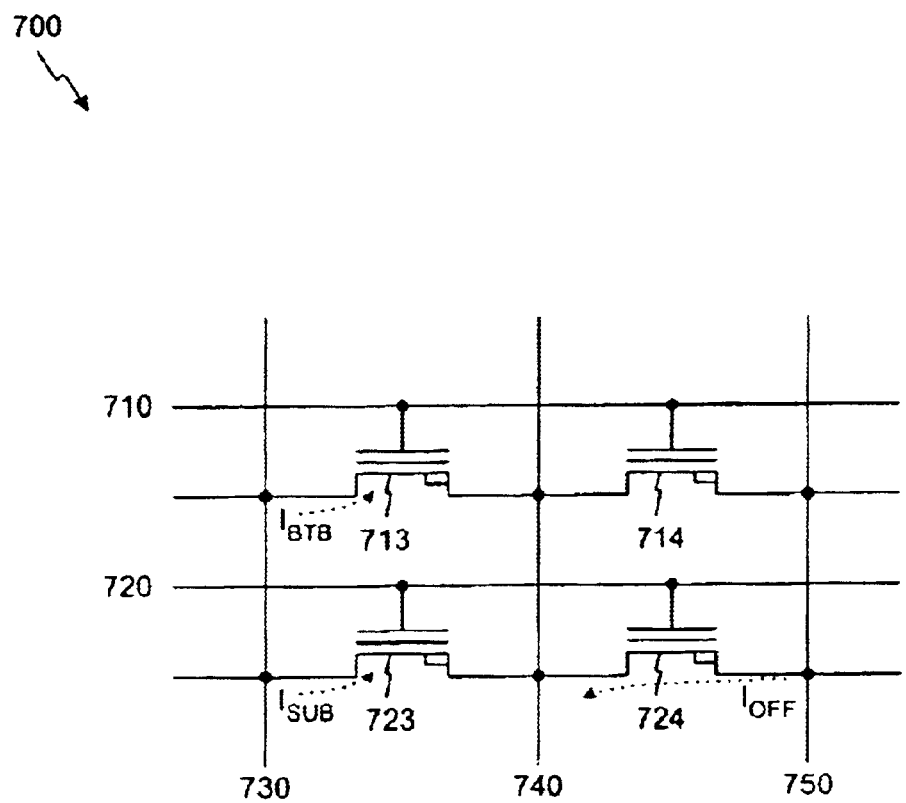
FIG. 7 is a schematic diagram showing various leakage currents in a group of four single transistor floating gate type memory cells of a virtual ground memory array.

Bit line voltage can also lead to current leakage in the memory array. FIG. 7 illustrates the various leakage mechanisms that exist amongst a group of four asymmetrical single transistor floating gate type memory cells in a virtual ground arrangement, like the virtual ground memory array 300 shown in FIG. 3. A cell on a selected page and on a selected bit line experiences band-to-band tunneling leakage current $I_{SUB}$. A cell on an unselected page but on a selected bit line experiences substrate leakage current $I_{SUB}$. A cell on an unselected page and on an unselected bit line experiences a cell leakage current $I_{OFF}$, which pulls up the voltage on the adjacent floating bit line.

The problem of bit disturb is reduced by discharging the floating bit lines during programming. FIG. 3 shows an illustrative programming discharge circuit 379 that includes a discharge control transistor for each of the bit lines, illustratively transistors 370–374 for the bit lines 320–324. The discharge control transistors 370–374 direct current into discharge section (or sections) 386. Although a single discharge section or a single collection of discharge sections are preferred for circuit section 386 to minimize the amount of space occupied by the programming discharge circuit 379, individual discharge elements may be used with each of the discharge control transistors 370–374 to implement one or more discharge sections for each of the bit lines 320–324. If desired, diode connected transistors 380–384 may be used in series with the discharge control transistors 370–374 to prevent reverse current flow into the bit lines 320–324. The discharge control transistors 370–374 are respectively controlled by discharge/program signals DP0, DP1, DP2, DP3 and DP4 so that a discharge transistor is turned oil if its bit line is floating, and is turned off if its bit line is carrying data. An example of one suitable technique for obtaining the discharge select signals from a volatile utility memory used for program-verify is described in commonly assigned copending U.S. Pat. application Ser. No. 10/349,384, filed Jan. 21, 2003 (Park et al., "Nonvolatile memory integrated circuit having volatile utility and buffer memories, and method of operation thereof,", which hereby is incorporated herein in its entirety by reference thereto.

The discharge section(s) 386 may be designed to provide only a single discharge technique throughout the entire programming sequence, or to provide different discharge techniques at various times throughout the programming sequence to establish an appropriate discharge profile for the amount and distribution or voltages likely to be coupled into floating bit lines.

Figure 8:
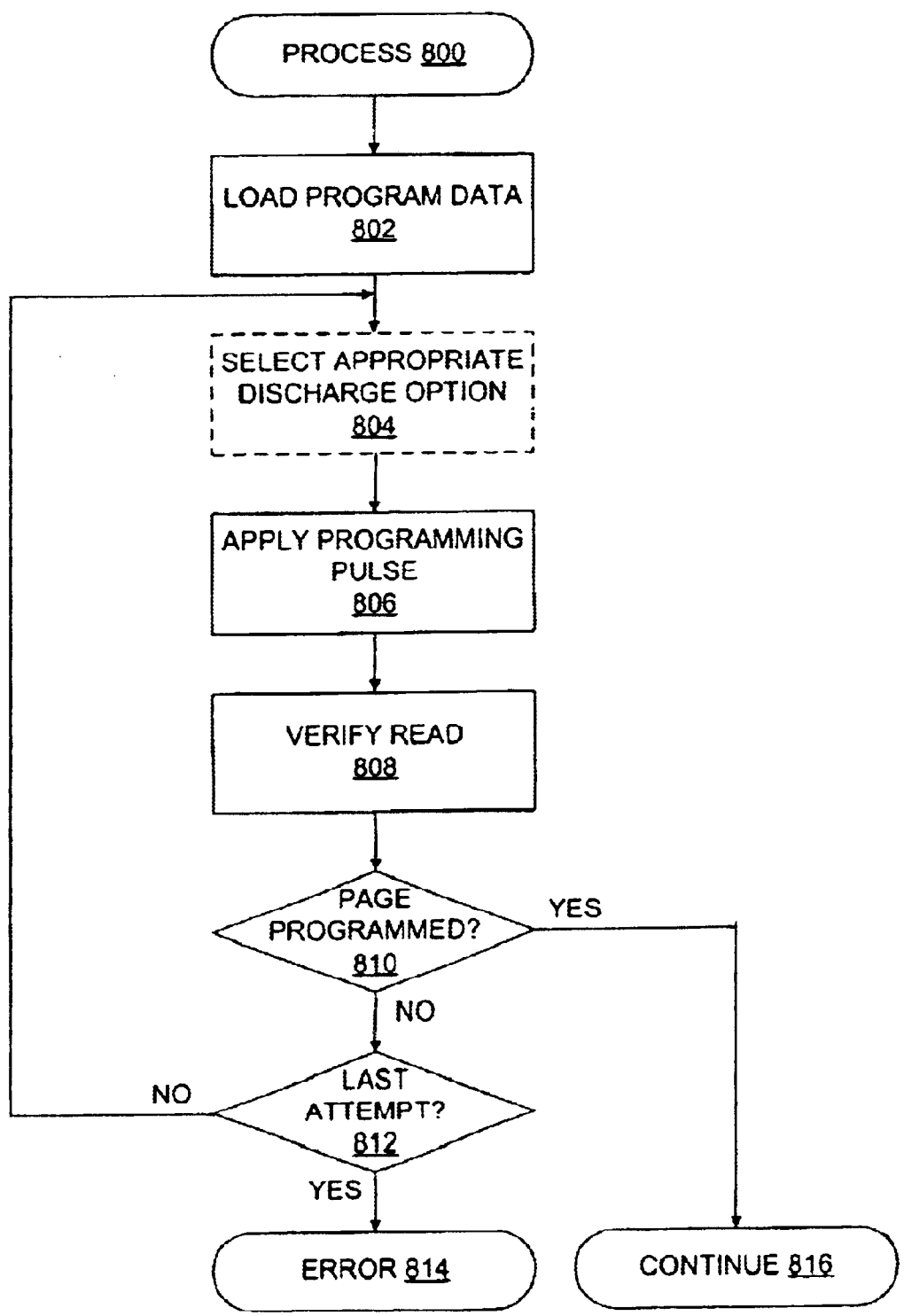
FIG. 8 is a flowchart showing a process for programming the virtual ground memory array of FIG. 3.
Figure 9:
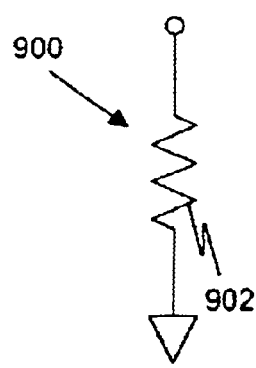
FIGS. 9–13 are schematic diagrams of various discharge circuits.
Figure 10:
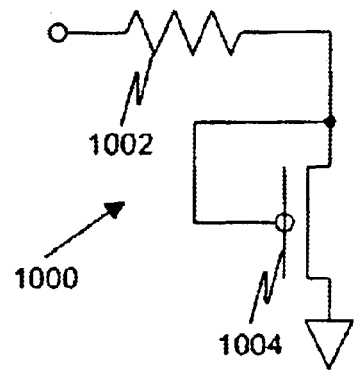

One technique for programming the memory array 300 of FIG. 3 is to use a pulse programming sequence of, for example, 16 pulses in which the bit lines for the cells to be programmed are at a moderate positive voltage of, for example, 5 volts, the bit lines for the other cells are floating, and the gale is varied front a moderate negative voltage of, for example, minus 5 volts to a high negative voltage of, for example, minus 12 volts in increments of, for example, 0.5 volts. An illustrative process 800 for programming the memory array 300 of FIG. 3 is shown in FIG. 8. The program data is loaded into a volatile read/write memory (block 802). A single discharge circuit section is used throughout programming, or optionally an appropriate discharge section is selected from several options (block 804 shown dashed) as described below. An appropriate programming pulse is applied to the gales of the selected cells (block 806). The initial pulse of, for example, negative 5 volts is a sufficiently low negative voltage so that only the fastest cells will program and no cells will over-program. A verify read of the selected cells is performed (block 808) in that selected cells that have been properly programmed and cells that are to remain erased are read as, for example, binary ones, while cells that are not yet properly programmed are read as, for example, binary zero. A determination is made as to whether the entire page has been properly programmed (does the verify read result in all ones) and if it has (block 810—yes), the process 800 is completed and other memory operations resume (block 816). If the entire page has not been properly programmed (block 810—no) and the programming sequence is not at an end (block 812—no), an appropriate discharge section (which may be tile same or a different discharge section) optionally is selected (block 804) and another programming pulse is applied (block 806). Each additional programming pulse is made at an incrementally higher negative voltage level so that slower memory cells eventually are programmed. In the event that one or more memory cells remain unprogrammed after a certain number of iterations, the program sequence terminates with an error signal (block 814).

The optional selection of the appropriate discharge circuit section (block 804) is based on the following. The first few programming pulses are of sufficiently low negative magnitude so that selected cells on unselected bit lines are unlikely to suffer bit disturb. For example, the initial programming pulse of minus 5 volts and program voltage of plus 5 volts presumes that only the fastest cells will program with a difference of only 10 volts. If 3.6 volts couple to the floating bit lines as described above, then the potential difference across the drain and control gate of a selected cell on an unselected bit line is only 8.6 volts for the first programming pulse, 9.1 volts for the second programming pulse, and 9.6 volts for the third programming pulse. Bit disturb is not likely to occur for these cells. However, leakage current remains a problem, so that the first few options could be optimized to handle the leakage current problem. In contrast, the later programming pulses are of sufficiently high negative magnitude so that selected cells on unselected bit lines might very possibly suffer bit disturb. For example, if 3.6 volts couple to the floating bit lines as described above, then the final programming pulse of minus 12 volts causes a potential difference across the drain and control gate of a selected cell on an unselected bit line of 15.6 volts. Bit disturb is possible at this level of potential difference. However, since relatively few cells will have to be programmed at the higher levels of the latter programming pulses, relatively few bit lines will carry the 5 volt programming voltage and the severity of the leakage current problem is diminished. Accordingly, the latter few options could be optimized to handle the bit disturb problem.

A variety of different discharge circuit sections are shown in FIGS. 9–13, and their respective characteristics are shown in FIG. 14. In FIG. 14, the parameter $I_0$ represents the current without source resistance, and the parameter I represents the current with resistance. The relationship between $I_0$ and I is set forth in equation (2) below.

$$I = \frac{I_o}{1 + RI_o} \quad (2)$$

Discharge section 900 is a single resistor, illustratively having a value of 4 KΩ. The characteristics of discharge section 900 are shown in FIG. 14 under column 900.

Discharge section 1000 is a single resistor, illustratively having a value of 2 KΩ, in series with a native NMOS diode-connected transistor. The characteristics of discharge section 1000 are shown in FIG. 14 under column 1000.

Discharge section 1100 is a single resistor, illustratively having a value of 1.2 KΩ, in series with an NMOS diode-connected transistor. The characteristics of discharge section 1100 are shown in FIG. 14 under column 1100.

Discharge section 1200 is a single resistor, illustratively having a value of 2 KΩ, in series with a parallel combination of a native NMOS diode-connected transistor and a resistor illustratively having a value of 40 KΩ.

Discharge section 1300 is a single resistor, illustratively having a value of 1.2 KΩ, in series with a parallel combination of an NMOS diode-connected transistor and a resistor illustratively having a value of 40 KΩ.

In the discharge sections of FIGS. 9–13, the relationship of the resistance of the single series resistor 902, the PMOS series resistor 1002, the NMOS series resistor 1102, and the parallel resistor 1202 illustratively is R, one half R, one third R, and ten R.

If the use of more that one discharge section during programming is desired, the selection of the desired discharge section may be based on any suitable criteria, including, for example, voltage-dependent switching and sequence-dependent switching. The design of such switching circuits is within the ability of one of ordinary skill in the art.

Figure 11:
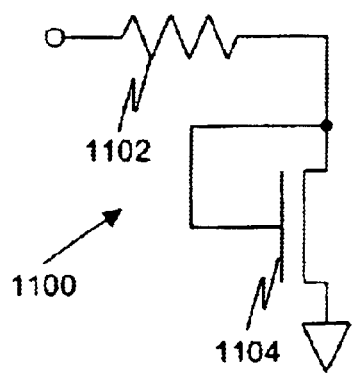
Figure 12:
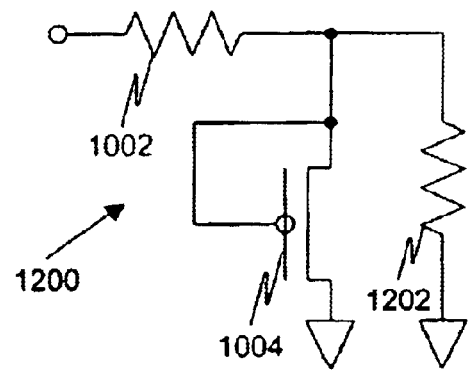
Figure 13:
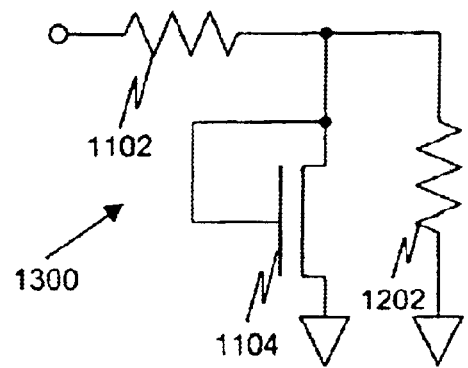

An example of the beneficial effects of the discharge circuit 390 using the single discharge section 1100 of FIG. 11 is shown in FIG. 6C and FIG. 6D. Each selected bit line illustratively ramps up to the program voltage of 5 volts in about 100 μs (see FIG. 6C, curve 630 between time lines 650 and 670). However, each of the floating unselected bit lines acquires a voltage that initially rises but then is quickly clamped to less than about 1 volt (see FIG. 6D, curve 640).

The description of the invention and its applications as set forth herein is illustrative and is not intended to limit the scope of the invention. Variations and modifications of the embodiments disclosed herein are possible, and practical alternatives to and equivalents of the various elements of the embodiments are known to those of ordinary skill in the art. For example, although a simple two state single transistor memory cell is described, bit line discharge may also be used with different types of memory cells including memory cells that store more that two states. While transistors are used for each of the bit lines to control connection to the discharge circuit section, other types of electronic switch or control elements may be used instead. While resistors and in some cases diode-connected transistors are used for the discharge sections, other types of electrical elements such as capacitors and inductors may be used to establish particular discharge characteristics. These and other variations and modifications of tile embodiments disclosed herein may be made without departing from the scope and spirit of the invention.

What is claimed:

1. A nonvolatile virtual ground integrated circuit memory array comprising:
    a plurality of nonvolatile memory cells;
    a plurality of bit lines, the bit lines being coupled to respective subsets of the memory cells; and
    a spurious programming voltage discharge circuit coupled to the bit lines and comprising:
        a plurality of discharge control elements coupled to the bit lines; and
        a discharge section coupled to the discharge control elements.

2. The memory array of claim 1 wherein the discharge control elements are transistors, and the discharge section comprises:
    a resistor; and
    a diode-connected transistor connected in series with the resistor.

3. The memory array of claim 1 wherein the discharge control elements are transistors, and the discharge section comprises a resistor.

4. The memory array of claim 1 wherein the discharge control elements are transistors, and the discharge section comprises:
    a first resistor;
    a second resistor connected in series with the first resistor; and
    a diode-connected transistor connected in series with the first resistor, the second resistor and the diode-connected transistor being connected in parallel.

5. A nonvolatile virtual ground integrated circuit memory array comprising:
    a plurality of nonvolatile memory cells;
    a plurality of bit lines, the bit lines being coupled to respective subsets of the memory cells; and
    a spurious programming voltage discharge circuit coupled to the bit lines and comprising:
        a plurality of discharge control elements coupled to the bit lines;
        a plurality of discharge sections; and
        a switching circuit having one terminal coupled to the discharge control elements and a plurality of terminals respectively coupled to the discharge sections.

6. The memory array of claim 5 wherein:
    at least one of the discharge sections is optimized for discharging spurious voltage from cell leakage; and
    at least one of the discharge sections is optimized for discharging spurious voltage from bit line coupling.

7. A nonvolatile virtual ground integrated circuit memory array comprising:
    a plurality of nonvolatile memory cells;
    a plurality of bit lines, the bit lines being coupled to respective subsets of the memory cells; and a spurious programming voltage discharge circuit coupled to the bit lines and comprising:
   a plurality of discharge control elements coupled to the bit lines; and
   a plurality of discharge sections respectively coupled to the discharge control elements.

8. A nonvolatile virtual ground integrated circuit memory array comprising:
   a plurality of nonvolatile memory cells;
   a plurality of bit lines, the bit lines being coupled to respective subsets of the memory cells and each of the bit lines comprising a main bit line and a plurality of sub-bit lines coupled to the main bit line; and
   a spurious programming voltage discharge circuit coupled to the main bit lines.

9. A nonvolatile virtual ground integrated circuit memory array comprising:
   a plurality of asymmetrical single transistor floating gate memory cells;
   a plurality of main bit lines;
   a plurality of sub-bit lines coupled to the memory cells, each of the bit lines being coupled to a subset of the sub-bit lines;
   a plurality of discharge control transistors respectively coupled to the bit lines; and
   a discharge section coupled to the discharge control elements.

10. A nonvolatile virtual ground integrated circuit memory array comprising:
   a plurality of asymmetrical single transistor floating gate memory cells;
   a plurality of main bit lines;
   a plurality of sub-bit lines coupled to the memory cells, each of the bit lines being coupled to a subset of the sub-bit lines;
   a plurality of discharge control transistors respectively coupled to the bit lines;
   a plurality of discharge sections wherein at least one of the discharge sections is optimized for discharging spurious voltage from cell leakage, and at least one of the discharge sections is optimized for discharging spurious voltage from bit line coupling; and
   a switching circuit having one terminal coupled to the discharge control transistors and a plurality of terminals respectively coupled to the discharge sections.

11. A method of discharging floating bit lines during programming of a nonvolatile virtual ground integrated circuit memory array having a plurality of memory cells, the method comprising:
   placing data on selected ones of the bit lines, wherein unselected ones of the bit lines are floated;
   apply a programming pulse to selected ones of the memory cells, whereby spurious voltages are coupled to the floated bit lines; and
   discharging the spurious voltages from the floated bit lines during at least part of the applying step.

12. The method of claim 11 further comprising repeating the placing, applying and discharging steps to program slower ones of the memory cells.

13. The method of claim 12 wherein:
   the initial discharging step is performed with a first discharge option; and
   the repeated discharging step is performed with a second discharge option different than the first discharge option.

14. The method of claim 11 further comprising:
   performing a verify read of the memory array to obtain verify data;
   repeating the placing, applying and discharging steps, wherein the data comprises the verify data.

15. The method of claim 11 wherein the discharging step comprises coupling a discharge circuit section to the floated bit lines during at least part of the applying step.

16. A method of discharging floating bit lines during programming of a nonvolatile virtual ground integrated circuit memory array having a plurality of memory cells, the method comprising:
   placing program data on first selected ones of the bit lines, wherein first unselected ones of the bit lines are floated;
   apply a first programming pulse to a selected page of the memory cells, wherein first spurious voltages are coupled to the first floated bit lines from the first selected bit lines;
   discharging the first spurious voltages from the first floated bit lines;
   performing a verify read of the memory array to obtain verify data;
   placing the verify data on second selected ones of the bit lines, wherein second unselected ones of the bit lines are floated;
   apply a second programming pulse to the selected page of the memory cells, wherein second spurious voltages are coupled to the second floated bit lines from the second selected bit lines; and
   discharging the second spurious voltages from the second floated bit lines.

17. The method of claim 16 wherein:
   the first spurious voltages discharging step is performed with a first discharge option; and
   the second spurious voltages discharging step is performed with a second discharge option different than the first discharge option.

18. The method of claim 16 further comprising repeating the verify read performing step, the verify data placing step, the second programming pulse applying step, and the second spurious voltage discharging step to program slower ones of the memory cells.

19. The method of claim 18 wherein:
   the first spurious voltages discharging step is performed with a first discharge option;
   the initial second spurious voltages discharging step is performed with a second discharge option different than the first discharge option; and
   the repeated second spurious voltages discharging step is performed with a third discharge option different than the first and second discharge options.

* * * * *